United States Patent [19]
Ikeda

[11] Patent Number: 5,243,574
[45] Date of Patent: Sep. 7, 1993

[54] SHARED SENSE AMPLIFIER TYPE SEMICONDUCTOR MEMORY DEVICE

[75] Inventor: Yuto Ikeda, Hyogo, Japan

[73] Assignee: Mitsubishi Denki Kabushiki Kaisha, Tokyo, Japan

[21] Appl. No.: 794,269

[22] Filed: Nov. 19, 1991

[30] Foreign Application Priority Data

Nov. 21, 1990 [JP] Japan ............................... 2-318676

[51] Int. Cl.⁵ ............................................... G11C 11/40
[52] U.S. Cl. ............................ 365/207; 365/189.07; 365/203; 365/205
[58] Field of Search ................... 365/203, 189.07, 207, 365/205

[56] References Cited

U.S. PATENT DOCUMENTS

| | | | |
|---|---|---|---|
| 4,858,195 | 8/1989 | Soneda | 365/203 X |
| 4,943,960 | 7/1990 | Komatsu et al. | 365/203 X |
| 4,967,395 | 10/1990 | Watanabe et al. | 365/203 |
| 5,020,031 | 5/1991 | Miyatake | 365/203 |

FOREIGN PATENT DOCUMENTS 63-2197  1/1988  Japan .

OTHER PUBLICATIONS

IEEE Journal of Solid-State Circuits, vol. SC-15, No. 5, Oct. 1980, "A 100 ns 5 V Only 64K×1 MOS Dynamic RAM", by Chan, et al., pp. 839-846.

*Primary Examiner*—Eugene R. LaRoche
*Assistant Examiner*—Do Hyun Yoo
*Attorney, Agent, or Firm*—Lowe, Price, LeBlanc & Becker

[57] ABSTRACT

A semiconductor memory device with two memory cell arrays. Memory cell arrays are commonly provided with a group of sense amplifiers. Each sense amplifier of a group of sense amplifiers is connected to a corresponding bit line pair within one memory cell array through a transmission transistor pair formed of N channel MOS transistors, and connected to a corresponding bit line pair within the other memory cell array through a transmission transistor pair formed of P channel MOS transistors. The same control signals are applied to gates of these transmission transistor pairs. The control signals maintain ½·Vcc level during a precharge period, and rise to high levels or fall down to low levels.

11 Claims, 8 Drawing Sheets

SHARED SENSE AMPLIFIER TYPE SEMICONDUCTOR MEMORY DEVICE

BACKGROUND OF THE INVENTION

1. Field of the Invention

The present invention relates to a semiconductor memory device, and more particularly to a shared sense amplifier type semiconductor memory device wherein a sense amplifier is shared by two sets of bit lines, and a method of operation thereof.

2. Description of the Background Art

FIG. 10 is a circuit diagram illustrating a configuration of a main part of a conventional shared sense amplifier type semiconductor memory device. This semiconductor memory device is of a configuration of folded bit lines.

Referring to FIG. 10, memory cell arrays 1a, 1b are commonly provided with a group of sense amplifiers 2. Memory cell array 1a includes a plurality of bit line pairs, a plurality of word lines crossing these bit lines, and a plurality of memory cells MC provided at their cross-over points. Two sets of bit line pairs BL1, $\overline{BL1}$ and BL3, $\overline{BL3}$, and two work lines WL1, WL2 are shown in FIG. 10. Similarly, memory cell array 1b includes a plurality of bit line pairs, a plurality of word lines crossing these bit line pairs, and a plurality of memory cells MC provided at their cross-over points. Two sets of bit line pairs BL2, $\overline{BL2}$ and BL4, $\overline{BL4}$, and two word lines WL3, WL4 are shown in FIG. 10. Each memory cell MC comprises a dynamic MOS memory including a MOS transistor and a storage capacity connected in series.

A group of sense amplifiers 2 include a plurality of balance type flipflop sense amplifiers 20 each of which amplifies potential difference produced between bit lines of a bit line pair due to a charge amount of the memory cells MC. Bit line pair BL1, $\overline{BL1}$ is connected to a sense node pair N1, N2 of sense amplifier 20 through a transmission transistor pair S11, S13 formed of two N channel MOS transistors. Bit line pair BL2, $\overline{BL2}$ is connected to a sense node pair N1, N2 through a transmission transistor pair S12, S14 formed of two N channel MOS transistors.

Bit line pair BL1, $\overline{BL1}$ is connected to an input/output line pair I/O, $\overline{I/O}$ through a transmission transistor pair T1, T2 formed of two N channel MOS transistors. Bit line pair BL2, $\overline{BL2}$ is connected to an input/output line pair I/O, $\overline{I/O}$ through a transmission transistor pair T3, T4 formed of two N channel MOS transistors. An equalizing transistor Q1 formed of an N channel MOS transistor is connected between bit line BL1 and bit line $\overline{BL1}$. An equalizing signal $\phi_{EQ}$ is applied to the gate of equalizing transistor Q1. A precharge electric potential $V_{BL}$ is applied to bit line BL1 through a precharge transistor Q2 formed of an N channel MOS transistor. A precharge signal $\Phi_{PR}$ is applied to the gate of precharge transistor Q2. Bit line pair BL2, $\overline{BL2}$ is connected to equalizing transistor Q1 and precharge transistor Q2 in the same manner.

A bit line pair BL3, $\overline{BL3}$ and a bit line pair BL4, $\overline{BL4}$ are structured in the same manner as bit line pair BL1, $\overline{BL1}$ and bit line pair BL2, $\overline{BL2}$. Column selection signals CS1, CS2 are applied from a column decoder 4a to the gates of a transmission transistor pair T1, T2 corresponding to bit line pair BL1, $\overline{BL1}$ and the gates of transmission transistor pair T1, T2 corresponding to bit line pair BL3, $\overline{BL3}$, respectively. Column selection signals CS3, CS4 are applied from a column decoder 4b to the gates of a transmission transistor pair T3, T4 corresponding to bit line pair BL2, $\overline{BL2}$ and the gates of a transmission transistor pair T3, T4 corresponding to bit line pair BL4, $\overline{BL4}$, respectively.

A control signal $\phi 1$ is applied to the gates of transmission transistor pair S11, S13, and a control signal $\phi 2$ is applied to gates of transmission transistor pair S12, S14.

The above shared sense amplifier type semiconductor memory device is disclosed, for example, in Japanese Patent Laying-Open No. 63-2197.

Operation of the semiconductor memory device of FIG. 10, in particular, operation at the time of reading and refreshing will be described with reference to a signal waveform diagram in FIG. 11.

During a precharge period, control signals $\phi 1$ and $\phi 2$ attain high levels (power supply potential Vcc). As a result, transistors S11–S14 are turned on. Equalizing signal $\phi_{EQ}$ and precharge signal $\phi_{PR}$ attain high levels. As a result, transistors Q1, Q2 are turned on, and precharge electric potential $V_{BL}$ (normally $\frac{1}{2} \cdot Vcc$ level) is supplied to bit line pairs BL1, $\overline{BL1}$–BL4, $\overline{BL4}$.

In a reading period, a row decoder (not shown) selects any of a plurality of word lines. Assuming that, for example, a word line WL1 is selected, at this time control signal $\phi 1$ maintains a high level, and control signal $\phi 2$ goes to a low level (ground potential). As a result, transistors S12, S14 are turned off. Information stored in memory cells MC connected to word line WL1 is read to corresponding bit lines $\overline{BL1}$, $\overline{BL3}$, respectively. As a result, potential differences are produced between bit line pair BL1 and $\overline{BL1}$, and between bit line pair BL3 and $\overline{BL3}$, respectively. Thereafter, when sense amplifiers 20 are activated, the potential differences are respectively amplified. Any of a plurality of column selection signals applied by column decoder 4a rises to a high level. For example, column selection signal CS1 attains a high level. As a result, a potential difference between bit line pair BL1 and $\overline{BL1}$ is transmitted to an input/output line pair I/O, $\overline{I/O}$.

In a case where one of word lines within memory cell array 1b is selected, control signal $\phi 1$ goes to a low level and control signal $\phi 2$ maintains a high level. Apart from that, the operation is the same as the above operation.

In the above conventional shared sense amplifier type semiconductor memory device, two control signals $\phi 1$, $\phi 2$ having different waveforms are required in order to turn on either transmission transistors S11, S13 or transmission transistors S12, S14. As a result, a problem exists that the number of interconnections increases as the number and the area of control signal generation circuits increase.

SUMMARY OF THE INVENTION

It is an object of the invention to simplify control signals and interconnections in a shared sense amplifier type semiconductor memory device.

It is a further object of the invention to reduce the number and the area of control signal generation circuits in the shared sense amplifier type semiconductor memory device.

It is a still further object of this invention to reduce the number of control signals for selectively connecting two sets of bit lines to the shared sense amplifiers in the shared sense amplifier type semiconductor device.

The semiconductor memory device in accordance with this invention comprises a first bit line to which a plurality of memory cells are connected, a second bit line to which a plurality of memory cells are connected, a sense amplifier with which the first and the second bit lines are commonly provided, a first switching device connected between the first bit line and the sense amplifier, a second switching device connected between the second bit line and the sense amplifier and a precharge circuit precharging the first and the second bit line to a prescribed potential during a precharge period. The first switching device is rendered conductive in response to a first potential and the second switching device is rendered conductive in response to a second potential.

This semiconductor memory device further comprises a control signal generation circuit.

The control signal generation circuit generates a control signal of which potential changes to the first potential or to the second potential in an access period and changes to an intermediate potential between the first potential and the second potential in a precharge period. The control signal is applied to the first and the second switching means by the control signal generation circuit.

In a precharge period, because the potential of the control signal changes to the intermediate potential between the first potential and the second potential, both the first switching device and the second switching device are rendered conductive to some extent. Under this condition, the precharge circuit precharges the first and the second bit line to a prescribed potential.

In an access period the potential of the control signal changes to the first or the second potential. As a result, either of the first switching device and the second switching device is rendered conductive, and therefore either of the first bit line and the second bit line is connected to the sense amplifier.

In the semiconductor memory device according to this invention, because one control signal performs shared sense amplifier operation, the number and the area of control signal generation circuits are decreased and therefore the number of interconnections is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
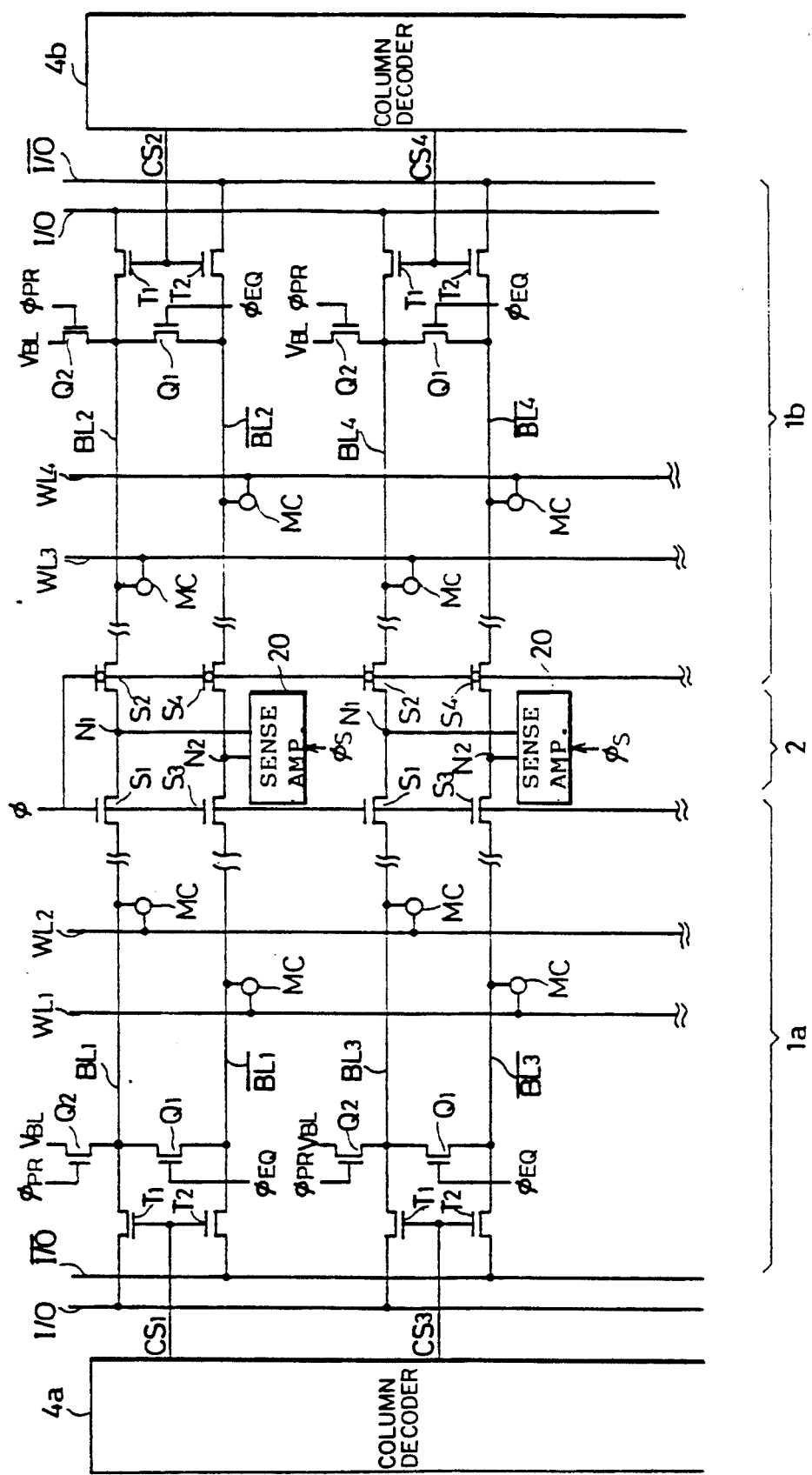
FIG. 1 is a circuit diagram showing a main part of a configuration of a shared sense amplifier type semiconductor memory device according to an embodiment of this invention.
Figure 2:
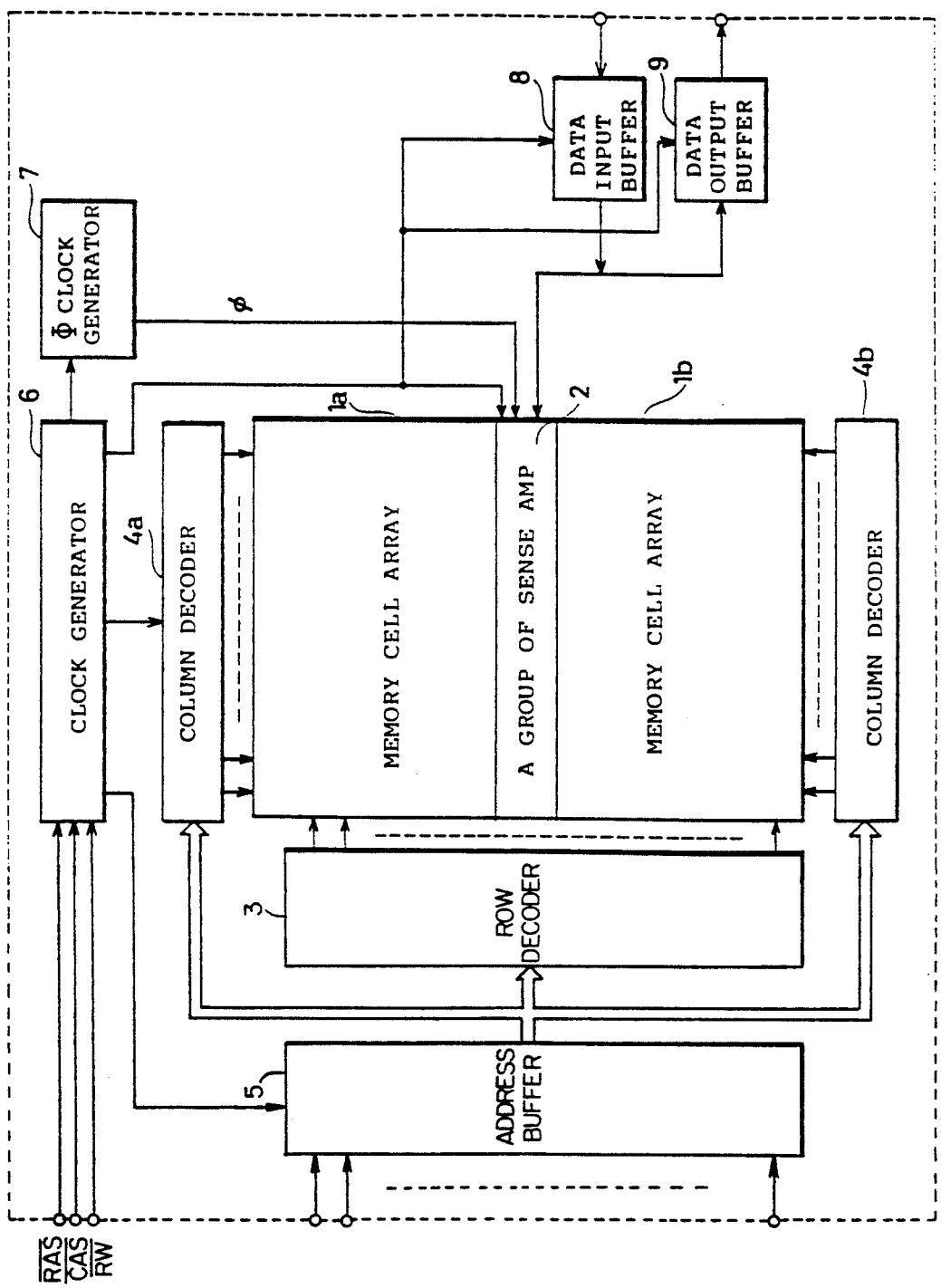
FIG. 2 is a block diagram showing the whole configuration of the semiconductor memory device of the same embodiment.

FIG. 1 is a circuit diagram showing a configuration of a main part of a shared sense amplifier type semiconductor memory device. FIG. 2 is a block diagram showing the whole configuration of the semiconductor memory device.

Figure 10:
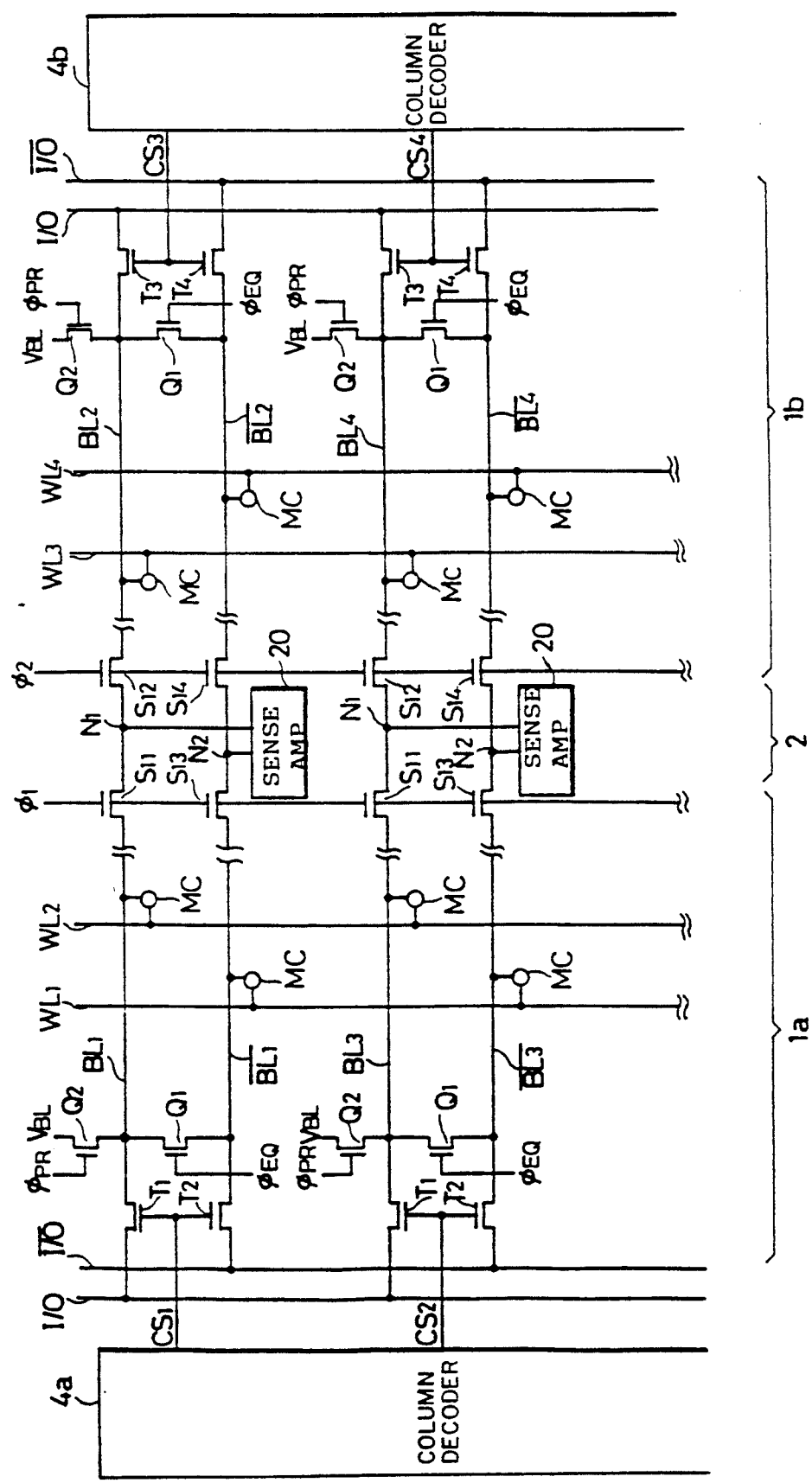
FIG. 10 is a circuit diagram showing a configuration of a main part of a conventional shared sense amplifier type semiconductor memory device.
Figure 11:
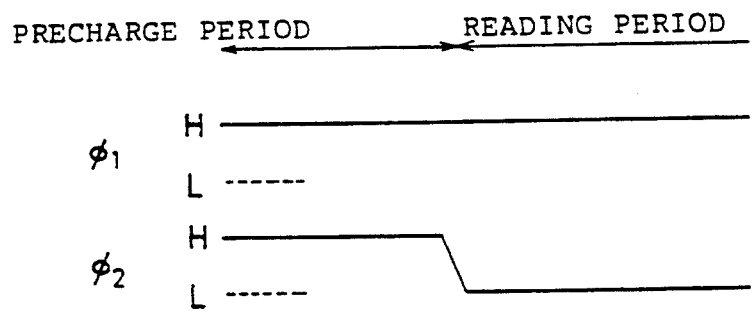
FIG. 11 is a signal waveform diagram for describing operation of the semiconductor memory device of FIG. 10.

Referring to FIG. 2, memory cell arrays 1a, 1b are commonly provided with a group of sense amplifiers 2. A row decoder 3 selects any one of a plurality of word lines within memory cell arrays 1a, 1b. A column decoder 4a is provided corresponding to memory cell array 1a, and column decoder 4b is provided corresponding to memory cell array 1b. An address buffer 5 applies an externally applied address signal to row decoder 3 and column decoder 4a, 4b. A clock generator 6 generates several kinds of control signals, each of which controls each corresponding part, in response to an external row address strobe signal $\overline{RAS}$, a column address strobe signal $\overline{CAS}$ and a read/write control signal $\overline{RW}$. A $\phi$ clock generator 7 generates a control signal $\phi$ in response to the control signal applied from the clock generator 6. Externally applied input data is input to memory cell arrays 1a, 1b through a data input buffer 8. Data read from memory cell arrays 1a, 1b through a group of sense amplifiers 2 is output as output data through a data output buffer 9. Referring to FIG. 1, the configuration of FIG. 1 differs from the configuration of FIG. 10 in the following points. Bit line pair BL1, $\overline{BL1}$ is connected to a sense node pair N1, N2 through a transmission transistor pair S1, S3 formed of two N channel MOS transistors. A bit line pair BL2, $\overline{BL2}$ is connected to sense node pair N1, N2 through a transmission transistor pair S2, S4 formed of two P channel MOS transistors. Similarly, a bit line pair BL3, $\overline{BL3}$ is connected to sense node pair Nl, N2 through transmission transistor pair S1, S3 formed of two N channel MOS transistors, and a bit line pair BL4, $\overline{BL4}$ is connected to sense node pair Nl, N2 through transmission transistor pair S2, S4 formed of two P channel MOS transistors. A control signal $\phi$ is applied to gates of transistors S1-S4.

With reference to signal waveform diagrams in FIG. 3 and 4, operation of the semiconductor memory device of FIG. 1 will be described.

First, referring to FIG. 3, a reading operation in a case where a memory cell within memory cell array 1a is selected will be described.

During a precharge period, a precharge signal $\phi_{PR}$ and equalizing signal $\phi_{EQ}$ maintain high levels. As a result, transistors Q1, Q2 are turned on, and bit line pairs BL1, $\overline{BL1}$-BL4, $\overline{BL4}$ are precharged to a precharge potential $V_{BL}$ ($\frac{1}{2}$·Vcc level). During a precharge period, the control signal $\phi$ maintains an intermediate potential ($\frac{1}{2}$·Vcc level) between a power supply potential Vcc and a ground potential. As a result, transistors S1-S4 are all rendered conductive to some extent. Thereafter precharge signal $\phi_{PR}$ goes to a low level, and equalizing signal $\phi_{ER}$ goes to a low level. As a result, transistors Q1, Q2 are turned off.

During a reading period (an access period), first, a control signal attains a high level. As a result, transistors S1, S3 are turned on and transistors S2, S4 are turned off. Bit line pair BL1, $\overline{BL1}$ and bit line pair BL3, $\overline{BL3}$ are, therefore, connected to corresponding sense node pairs N1, N2, respectively. Meanwhile bit line pair BL2, $\overline{BL2}$ and bit line pair BL4, $\overline{BL4}$ are cut off from corresponding sense node pairs N1, N2, respectively.

Row decoder 3 (refer to FIG. 2) selects a word line WL1, for example. As a result, the potential of the word line WL1 rises to a high level. As a result, information is read to respective bit lines $\overline{BL1}$ and BL3 from memory cells MC connected to the word line WL1, so that potential differences are respectively produced between bit line pair BL1 and $\overline{BL1}$, and between bit line pair BL3 and BL3.

A sense amplifier activation signal $\phi_S$ applied to each sense amplifier 20 rises to a high level. As a result, the potential differences between each bit line pair are amplified. Subsequently, column decoder 4a raises, for example, the potential of a column selection signal CS1 to a high level. As a result, the potential difference between bit line pair BL1 and $\overline{BL1}$ is transmitted to an input/output pair I/O, $\overline{I/O}$. The potential difference between I/O, $\overline{I/O}$ is read to the outside as output data through a data output buffer 9 (refer to FIG. 2).

Secondly, the reading operation in a case where a memory cell with memory cell array 1b is selected will be described with reference to FIG. 4.

Figure 3:
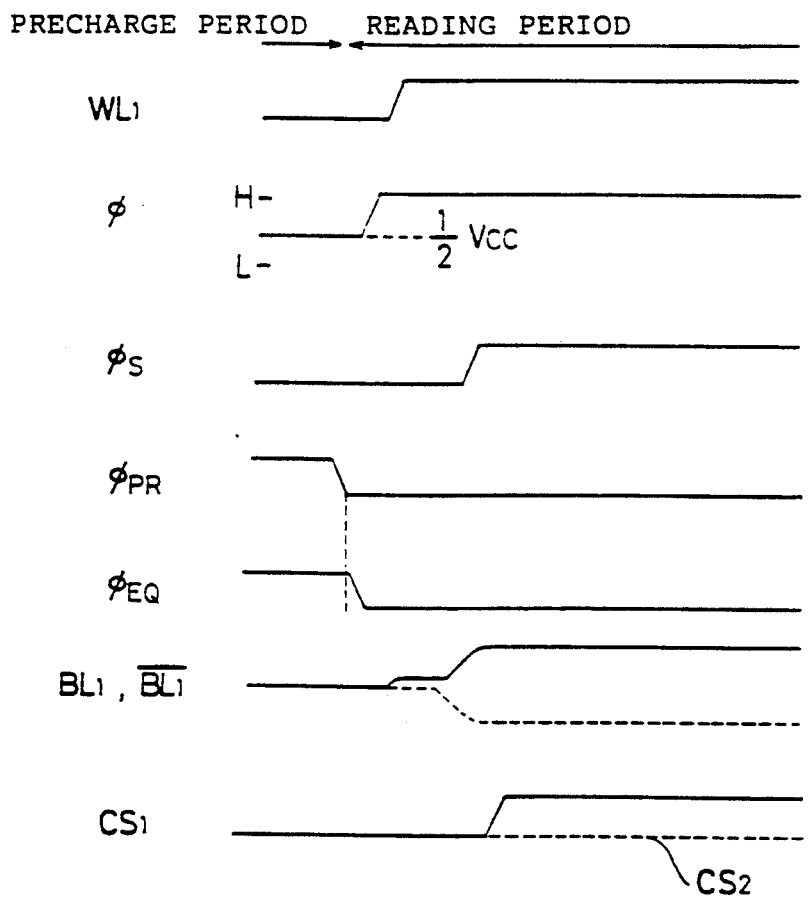
FIGS. 3 and 4 are signal waveform diagrams showing operation of the semiconductor memory device of FIG. 2.
Figure 4:
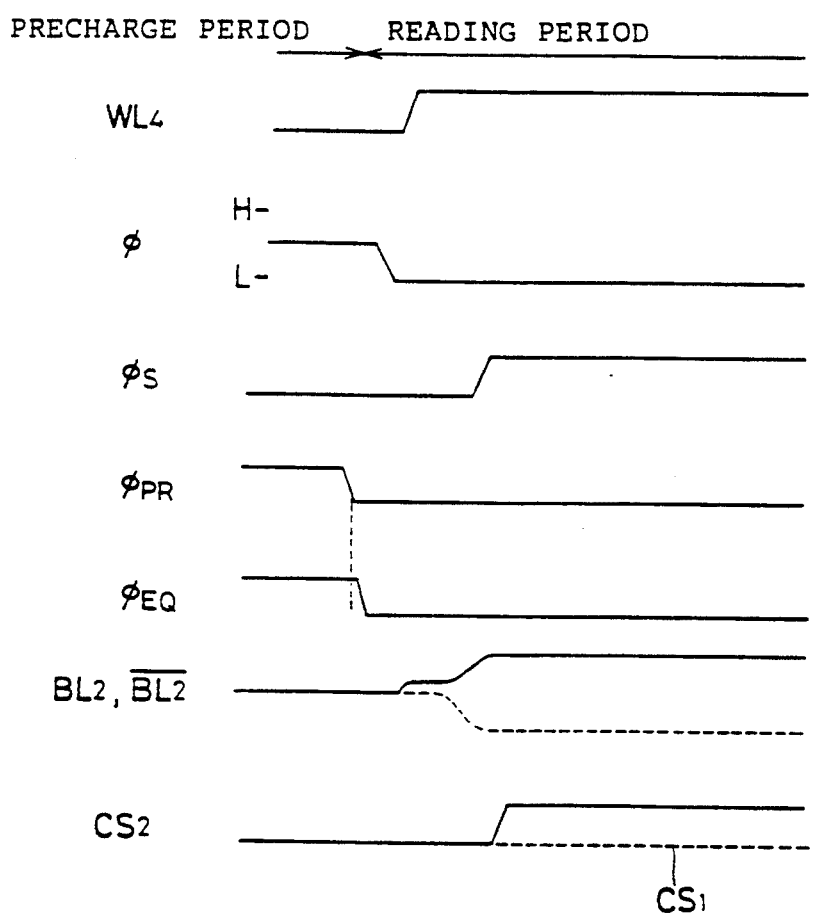

Operation during a precharge period is the same as that shown in FIG. 3. During a reading period, first, a control signal falls down to a low level. As a result, transistors S1, S3 are turned off and transistors S2, S4 are turned on. A bit line pair BL2, $\overline{BL2}$ and a bit line pair BL4, $\overline{BL4}$ are, therefore, connected to corresponding sense node pairs N1, N2, respectively, while bit line pair BL1, $\overline{BL1}$ and bit line pair BL3, $\overline{BL3}$ are cut off from corresponding sense node pairs N1, N2, respectively.

Subsequently, row decoder 3 (refer to FIG. 2) selects, for example, a word line WL4. As a result the potential of word line WL4 rises to a high level. Consequently, information is read from memory cells MC connected to word line WL4 to respectively corresponding bit line $\overline{BL2}$, BL4, respectively, so that potential differences are produced between bit line pair BL2 and $\overline{BL2}$ and between bit line pair BL4 and $\overline{BL4}$, respectively.

When a sense amplifier activation signal $\phi_S$ rises to a high level, the potential differences between bit line pair BL2 and $\overline{BL2}$ and between bit line pair BL4 and $\overline{BL4}$ are respectively amplified. Subsequently, column decoder 4b raises, for example, the potential of a column signal CS2 to a high level. As a result, the potential difference between bit line pair BL2 and $\overline{BL2}$ is transmitted to an input/output pair I/O, $\overline{I/O}$.

In the above embodiment, one control signal $\phi$ can control the shared sense amplifier operation in a precharge period and in an access period.

Figure 5:
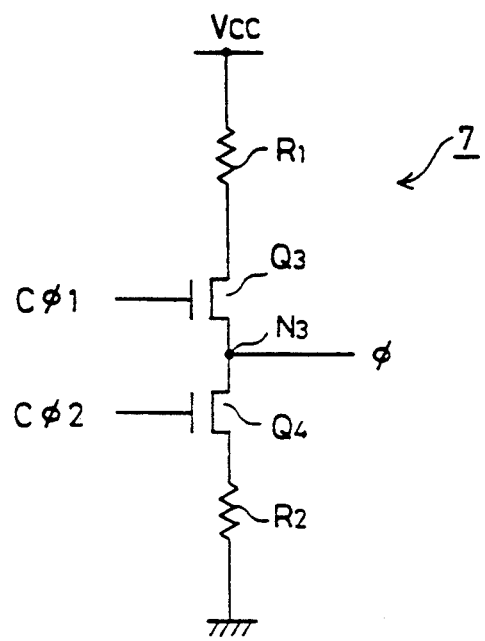
FIG. 5 is a circuit diagram showing one example of a configuration of a $\phi$ clock generator.

FIG. 5 is a circuit diagram showing one example of a configuration of $\phi$ clock generator 7 included in FIG. 2.

This $\phi$ clock generator 7 includes two resistors R1, R2 and two N channel MOS transistors Q3, Q4. Resistor R1 and transistor Q3 are connected in series between a power source terminal receiving a power supply potential V cc and an output node N3. Resistor R2 and transistor Q4 are connected in series between a ground terminal and output node N3. Clock signals C$\phi$1, C$\phi$2 are applied from clock generator 6 (FIG. 2) to gates of transistors Q3 and Q4.

Figure 6:
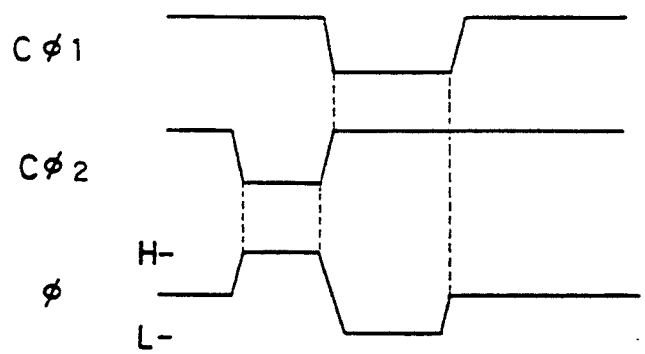
FIG. 6 is a signal waveform diagram for describing operation of the $\phi$ clock generator of FIG. 5.

Referring to a signal waveform diagram of FIG. 6, operation of $\phi$ clock generator 7 of FIG. 5 will be described.

When clock signals C$\phi$1, C$\phi$2 are at a high level, transistors Q3, Q4 are turned on, so that control signal $\phi$ attains $\frac{1}{2}$·Vcc level. When clock signal C$\phi$2 falls down to a low level, transistor Q4 is turned off. As a result, a control signal $\phi$ attains a high level. Additionally, when clock signal C$\phi$1 falls down to a low level and clock signal C$\phi$2 rises to a high level, transistor Q3 is turned off, and transistor Q4 is turned on. As a result, control signal $\phi$ falls down to a low level.

Figure 7:
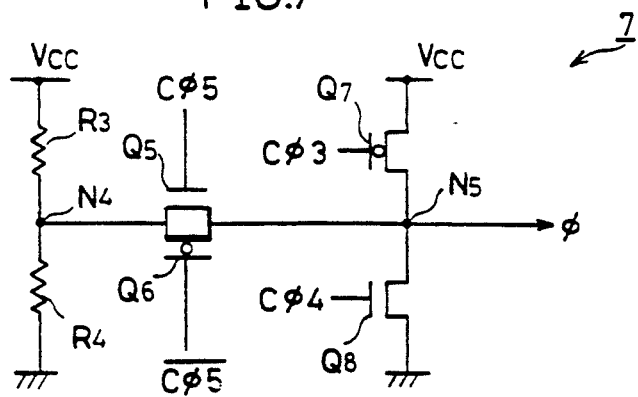
FIG. 7 is a circuit diagram showing a further example of a configuration of the $\phi$ clock generator.

FIG. 7 is a circuit diagram showing another example of a configuration of $\phi$ clock generator 7 shown in FIG. 2.

$\phi$ clock generator 7 comprises two resistors R3, R4, two N channel MOS transistors Q5, Q8 and two P channel MOS transistors Q6, Q7. A resistor R3 is connected between a power source terminal and a node N4. A resistor R4 is connected between a ground terminal and node N4. Transistors Q5, Q6 are connected in parallel between node N4 and node N5. A transistor Q7 is connected between the power source terminal and node N5, and a transistor Q8 is connected between the ground terminal and node N5. Clock signals C$\phi$3, C$\phi$4, C$\phi$5, $\overline{C\phi5}$ are applied from clock generator 6 (FIG. 2) to gates of transistor Q7, transistor Q8, transistor Q5 and transistor Q6, respectively.

Figure 8:
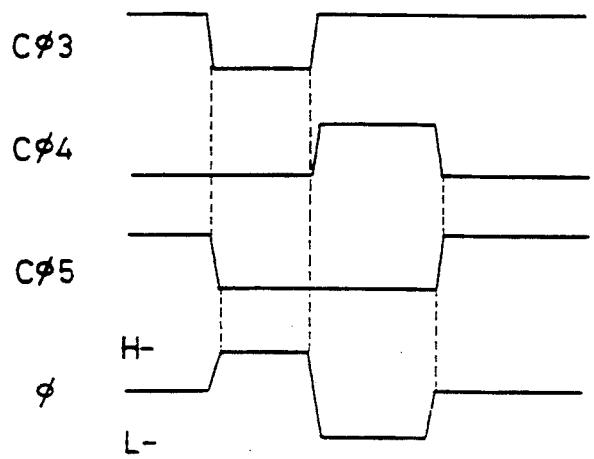
FIG. 8 is a signal waveform diagram for describing operation of the $\phi$ clock generator of FIG. 7.

Referring to a signal waveform diagram of FIG. 8, operation of $\phi$ clock generator 7 of FIG. 7 will be described.

When clock signals C$\phi$3, C$\phi$5 are at high levels and a clock signal C$\phi$4 is at a low level, transistors Q7, Q8 are turned off and transistors Q5, Q6 are turned on. As a result, the control signal is at $\frac{1}{2}$·Vcc level. When clock signals C$\phi$3, C$\phi$5 fall down to low levels, transistors Q5, Q6 are turned off and transistor Q7 is turned on. As a result, control signal $\phi$ rises to a high level. When clock signals C$\phi$3, C$\phi$4 rise to high levels, transistor Q7 is turned off and transistor Q8 is turned on. As a result, clock signal $\phi$ falls down to a low level.

Figure 9:
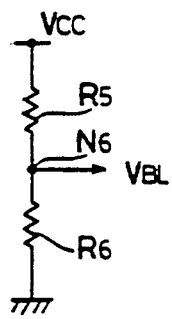
FIG. 9 is a circuit diagram showing one example of a configuration of a precharge potential generation circuit.

One example of a configuration of a precharge potential generation circuit for generating a precharge potential $V_{BL}$ is shown in FIG. 9.

As shown in FIG. 9, resistors R5, R6 are connected in series between the power supply terminal and the ground terminal. $\frac{1}{2}$·Vcc level precharge potential $V_{BL}$ is obtained from node N6.

According to the above embodiment, because one control signal $\phi$ can control the shared sense amplifier operation, the number of interconnections for control signals can be reduced as the area of control signal generation circuits ($\phi$ clock generators) can be decreased.

While this invention is applied to folded bit line type shared sense amplifiers in the above embodiment, it is possible to apply this invention to open bit line type shared sense amplifiers.

As described above, according to this invention, because one control signal can control the shared sense amplifier operation during a precharge period and an access period, the number of interconnections for control signals can be reduced as the number and the area of control signal generation circuits can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   first bit lines;
   second bit lines;
   a plurality of memory cells, each connected to said first bit lines or to said second bit liens for storing data;
   sense amplifying means provided commonly to said first and second bit lines;
   first switching means connected between said first bit lines and said sense amplifying means and responsive to a first potential for being rendered conductive;
   second switching means connected between second bit lines and said sense amplifying means and responsive to a second potential for being rendered conductive;
   precharging means for precharging said first and second bit lines to a prescribed potential during a precharge period; and
   control signal generation means for generating a common control signal, the potential of which changes to said first potential or said second potential during an access period and changes to an intermediate potential between said first potential and said second potential during the precharge period for applying the common control signal to said first and second switching means.

2. The semiconductor memory device according to claim 1, wherein
   said first switching means comprises N channel type field effect devices,
   said second switching means comprises P channel type field effect devices, and
   said first potential corresponds to a logic high level and said second potential corresponds to a logic low level.

3. The semiconductor memory device according to claim 2, wherein said prescribed potential corresponds to an intermediate level between said logic high level and said logic low level.

4. The semiconductor memory device according to claim 2 further comprising:
   equalizing means equalizing potentials of said first and second bit liens during the precharge period.

5. A semiconductor memory device, comprising:
   first bit lines;
   second bit lines;
   a plurality of memory cells, each connected to said first bit lines or to said second bit liens for storing data;
   sense amplifying means provided commonly to said first and second bit lines;
   first switching means connected between said first bit lines and said sense amplifying means and responsive to a first potential for being rendered conductive;
   second switching means connected between second bit lines and said sense amplifying means and responsive to a second potential for being rendered conductive;
   precharging means for precharging said first and second bit lines to a prescribed potential during a precharge period; and
   control signal generation means for generating a control signal, the potential of which changes to said first potential or said second potential during an access period and changes to an intermediate potential between said first potential and said second potential during the precharge period for applying the control signal to said first and second switching means, wherein
   said first switching means comprises N channel type field effect devices,
   said second switching means comprises P channel type Field effect devices,
   said first potential corresponds to a logic high level and said second potential corresponds to a logic low level, and
   said control signal generation means comprises:
   a first terminal receiving a power supply potential corresponding to said first potential;
   a second terminal receiving a power supply corresponding to said second potential;
   an output node outputting said control signal;
   first resistor mans connected to said first terminal;
   third switching means connected between said first resistor means and said output node;
   second resistor means connected to said second terminal;
   fourth switching means connected between said second resistor mans and said output node; and
   control means for turning on either of said third and fourth switching means during said access period and for turning on both of said third and fourth switching means during said precharge period.

6. The semiconductor memory device according to claim 5, wherein
   said control means generates a first and a second clock signal, and
   aid third switching means comprises a field effect device having a control terminal receiving said first clock signal, and
   said fourth switching means comprises a field effect device having a control terminal receiving said second clock signal.

7. A semiconductor memory device, comprising:
   first bit lines;
   second bit lines;
   a plurality of memory cells, each connected to said first bit lines or to said second bit lines for storing data;
   sense amplifying means provided commonly to said first and second bit lines;
   first switching means connected between said first bit lines and said sense amplifying means and responsive to a first potential for being rendered conductive;
   second switching means connected between second bit lines and said sense amplifying means and responsive to a second potential for being rendered conductive;
   precharging means for precharging said first and second bit lines to a prescribed potential during a precharge period; and
   control signal generation means for generating a control signal, the potential of which changes to said first potential or said second potential during an access period and changes to an intermediate potential between said first potential and said second potential during the precharge period for applying the control signal to said first and second switching means, wherein said first switching means comprises N channel type field effect devices, said second switching means comprises P channel type Field effect devices, said first potential corresponds to a logic high level and said second potential corresponds to a logic low level, and said control signal generation means comprises:

a first terminal receiving a power supply potential corresponding to said first potential;

a second terminal receiving a power supply potential corresponding to said second potential;

a first node;

first resistor means connected between said first terminal and said first node;

second resistor means connected between said second terminal and said first node;

a second node;

transfer-gate means connected between said first node and said second node;

third switching means connected between said first terminal and said second node;

fourth switching means connected between second terminal and said second node; and control means for turning on either of said third and fourth switching means and for turning off said transfer-gate means during aid access period, and for turning on said transfer-gate means and for turning off both of said third and fourth switching means during said precharge period.

8. The semiconductor memory device according to claim 7, wherein said control means generates a first, a second and a third clock signal, said third switching means comprises a field effect device having a control terminal receiving said first clock signal, said fourth switching means comprises a field effect device having a control terminal receiving said second clock signal, said transfer-gate means comprises field effect devices having a control terminal receiving said third clock signal.

9. A semiconductor memory device comprising:

a first memory cell array including
a plurality of first bit line pairs,
a plurality of word lines crossing said plurality of first bit lines,
a plurality of memory cells provided at crossover points of said plurality of first bit line pairs and said plurality of word lines;

a second memory cell array including,
a plurality of second bit line pairs
a plurality of word lines crossing said plurality of second bit line pair, and
a plurality of memory cells provided at crossover points of said plurality of second bit line pairs and said plurality of word lines;

a plurality of sense amplifying means provided commonly to said plurality of first bit line pairs and said plurality of second bit line pairs;

a plurality of first switching means, each connected between a corresponding first bit line pair and corresponding sense amplifying means and responsive to a first potential for being rendered conductive;

a plurality of second switching means, each connected between corresponding second bit line pair and corresponding sense amplifying means and responsive to a second potential for being rendered conductive;

a plurality of precharging means corresponding to said plurality of first bit line pairs and said plurality of second bit line pairs for precharging a corresponding bit line pair to a prescribed potential; and control signal generation means for generating a common control signal, the potential of which changes to said first potential or to said second potential and changes to an intermediate potential between said first potential and said second potential during a precharge period for applying the common control signal to said plurality of first and second switching means.

10. The semiconductor memory device according to claim 9, wherein each of said plurality of first switching means comprises N channel type field effect devices, each of said plurality of second switching means comprises P channel field effect devices, said first potential corresponds to a logic high level, and said second potential corresponds to a logic low level.

11. A method of operation of semiconductor memory device comprising first bit lines, second bit lines, a plurality of memory cells connected to either of said first bit lines and said second bit lines, sense amplifying means provided commonly to said first and second bit lines;

first switching means connected between said first bit lines and said sense amplifying means and responsive to a first potential for being rendered conductive, and second switching means connected between said second bit lines and said sense amplifying means and responsive to a second potential for being rendered conductive, said method comprising steps of:

precharging said first and second bit lines to a prescribed potential during a precharge period;

applying a common control signal having said first and said second potential during an access period to said first and second switching means; and applying the common control signal having an intermediate potential between said first potential and said second potential during the precharge period to said first and said second switching means.

* * * * *